United States Patent
Chiu et al.

(10) Patent No.: US 12,342,488 B2
(45) Date of Patent: Jun. 24, 2025

(54) COVERS FOR ELECTRONIC DEVICES

(71) Applicant: Hewlett-Packard Development Company, L.P., Spring, TX (US)

(72) Inventors: Chien-Chih Chiu, Taipei (TW); Hsin-Chien Chu, Taipei (TW); Kuan-Ting Wu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 314 days.

(21) Appl. No.: 18/013,753

(22) PCT Filed: Jul. 31, 2020

(86) PCT No.: PCT/US2020/044448
§ 371 (c)(1),
(2) Date: Dec. 29, 2022

(87) PCT Pub. No.: WO2022/025917
PCT Pub. Date: Feb. 3, 2022

(65) Prior Publication Data
US 2023/0262912 A1    Aug. 17, 2023

(51) Int. Cl.
C25D 11/02        (2006.01)
C25D 11/30        (2006.01)
G06F 1/16         (2006.01)
H05K 5/03         (2006.01)

(52) U.S. Cl.
CPC ............. *H05K 5/03* (2013.01); *C25D 11/026* (2013.01); *C25D 11/30* (2013.01); *G06F 1/1656* (2013.01)

(58) Field of Classification Search
CPC ......... C23C 28/00; C23C 28/04; C23C 28/30; C25D 11/026; C25D 11/14; C25D 11/24; C25D 11/26; C25D 11/30; C25D 11/34; C25D 11/02; G06F 1/1656; G06F 1/16; H05K 5/03
USPC ........................................................ 361/807
See application file for complete search history.

(56) References Cited

U.S. PATENT DOCUMENTS

| | | | |
|---|---|---|---|
| 4,894,093 A | * | 1/1990 | Aderhold ................ C09C 1/027 423/544 |
| 6,936,349 B2 | | 8/2005 | Naganuma et al. |
| 9,797,036 B2 | | 10/2017 | Liu et al. |

(Continued)

FOREIGN PATENT DOCUMENTS

| | | | | |
|---|---|---|---|---|
| CN | 101831683 A | | 9/2010 | |
| CN | 107217290 A | * | 9/2017 | ............. C25D 11/30 |
| CN | 108950549 A | | 12/2018 | |

(Continued)

OTHER PUBLICATIONS

Influence of TiO2 on Water Pollution Treatment_Zeng_pp. 953 to 956_2013.*

*Primary Examiner* — Timothy J Thompson
*Assistant Examiner* — Guillermo J Egoavil
(74) *Attorney, Agent, or Firm* — Shook, Hardy & Bacon L.L.P.

(57) ABSTRACT

The present disclosure is drawn to covers for electronic devices. In one example, a cover for an electronic device can include a light metal substrate including a first surface. A first micro-arc oxidation layer may be on the first surface of the light metal substrate, the first micro-arc oxidation layer can include a cationic dye bonded to the first surface via an anionic inorganic bridging compound.

15 Claims, 4 Drawing Sheets

(56) References Cited

U.S. PATENT DOCUMENTS

2012/0122997 A1\* 5/2012 Abbott .................. C08L 5/12
426/573
2013/0221816 A1 8/2013 Liou et al.

FOREIGN PATENT DOCUMENTS

| PL | 426928 A1 \* | 3/2020 | ............. B01J 20/06 |
|---|---|---|---|
| RU | 2366126 C1 | 8/2009 | |
| RU | 2367728 C1 | 9/2009 | |
| RU | 2570869 C1 | 12/2015 | |
| WO | 2004/037934 A1 | 5/2004 | |
| WO | 2006/087313 A1 | 8/2006 | |

\* cited by examiner

COVERS FOR ELECTRONIC DEVICES

BACKGROUND

The use of personal electronic devices of all types continues to increase. Cellular phones, including smartphones, have become nearly ubiquitous. Tablet computers have also become widely used in recent years. Portable laptop computers continue to be used by many for personal, entertainment, and business purposes. For portable electronic devices in particular, much effort has been expended to make these devices more useful is and more powerful while at the same time making the devices smaller, lighter, and more durable. The aesthetic design of personal electronic devices is also of concern in this competitive market. Devices such as mobile phones, tablets and portable computers may be provided with a casing. The casing typically provides a number of functional features, e.g. protecting the device from damage.

DETAILED DESCRIPTION

Figure 1A:
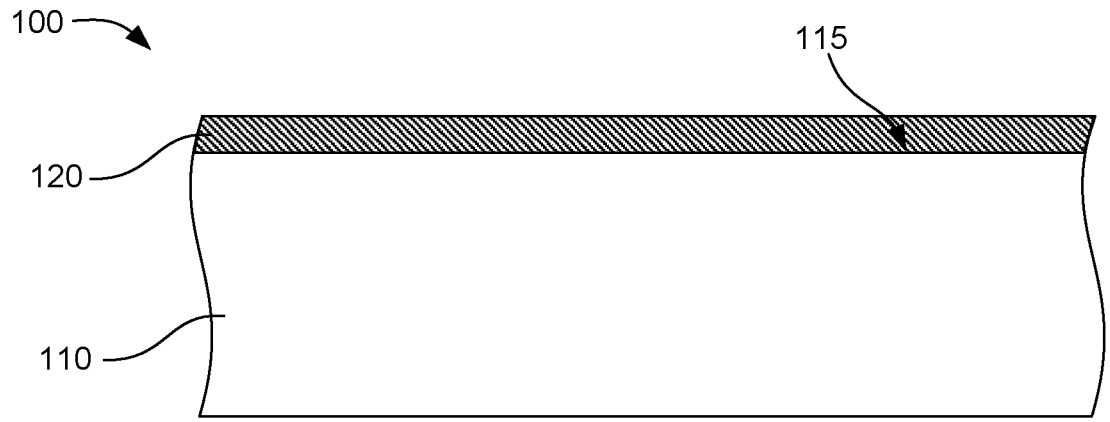
FIGS. 1A-1B are cross-sectional views illustrating an example cover for an electronic device in accordance with examples of the present disclosure.

The present disclosure describes covers for electronic devices. In one example, a cover for an electronic device can include a light metal substrate including a micro-arc oxidation (MAO) layer, the micro-arc oxidation layer can include a cationic dye bonded to an anionic inorganic protective compound. The cationic dye with the anionic inorganic bridging compound can cause the MAO layer to form a colored layer over the light metal substrate. The cationic dye bonded to the anionic inorganic protective compound allows the cationic dye to resist ultrahigh temperature oxidation resistance up to about 1,500° C., and in some instances, more than about 1,500° C. This prevents the cationic dye from burning during an MAO process which can occur for an un-bonded cationic dye in an MAO process.

In one example, a cover for an electronic device includes a light metal substrate including an outer surface. The cover further includes a colored micro-arc oxidation layer on the outer surface of the light metal substrate, the colored micro-arc oxidation layer including a cationic dye bonded to an anionic inorganic protective compound. The light metal substrate can include aluminum, magnesium, lithium, zinc, titanium, niobium, stainless steel, copper, an alloy thereof, or a composite thereof. The anionic inorganic protective compound can include a silicate compound. In another example, the anionic inorganic protective compound can include a silicate compound with a tripolyphosphate and/or a hexametaphosphate. The cationic dye can be a water-soluble dye including methylene blue, basic fuchsin, crystal violet, eosin, acid fuchsin, congo red, gentian violet, methyl violet, brilliant crystal glue, romanowsky dye, anthraquinone dyes, acridine orange, quinone-imine dyes, xanthene dyes, 2-amino-4-(azoyl)-azo-thiazole, basic blue 41 (C.I. 11105), C.I. acid blue 45, acid dye, alkaline dye, or a combination thereof. The colored micro-arc oxidation layer can be applied using a solution or dispersion including potassium fluoride, potassium hydroxide or sodium hydroxide, fluorozirconate, sodium hexametaphosphate, sodium fluoride, ferric ammonium oxalate, phosphoric acid salt, graphite powder, silicon dioxide powder, polyethylene oxide alkylphenolic ether, or a combination thereof. The colored micro-arc oxidation layer can be applied using a solution or dispersion including a surfactant wherein the surfactant includes alcohol sulfates, alkylbenzene sulfonates, sodium caseinate, sodium polyacrylate, sodium polyoxyethylene alkyl ether carboxylate, sodium dodecyl sulfate, or a combination thereof. The cover can further include a coating layer over the colored micro-arc oxidation layer, the coating layer including a primer coat, a base paint coat, a top coat, an anti-fingerprint coat, or a combination thereof. The cationic dye can provide a color at the colored micro-arc oxidation layer that is a same color as a coating color provided by the coating layer. The cover can further include a second colored micro-arc oxidation layer on a second outer surface of the light metal substrate, wherein the second outer surface faces opposite the outer surface.

In one example, an electronic device includes an electronic component. The electronic device further includes a cover enclosing the electronic component. The cover includes light metal substrate. The cover further includes a colored micro-arc oxidation layer on the outer surface of the light metal substrate, the first colored micro-arc oxidation layer including a cationic dye bonded to an anionic inorganic protective compound. The electronic device can be a laptop, a desktop computer, a keyboard, a mouse, a smartphone, a tablet, a monitor, a television screen, a speaker, a game console, a video player, an audio player, or a combination thereof. The electronic device can further include a coating layer over the colored micro-arc oxidation layer, the coating layer including a primer coat, a base paint coat, a top coat, an anti-fingerprint coat, or a combination thereof.

In one example, a method of making a cover for an electronic device includes bonding an anionic inorganic protective compound with a cationic dye in a solution or dispersion. The method further includes submersing a light metal substrate including an outer surface thereon in the solution or dispersion. The method further includes forming a colored micro-arc oxidation layer on the outer surface, the colored micro-arc oxidation layer including the cationic dye bonded to the anionic inorganic protective compound. The method can further include applying a coating layer on the colored micro-arc oxidation layer, wherein the coating layer includes a primer coat, a base paint coat, a top coat, an anti-fingerprint coat, or a combination thereof.

It is noted that when discussing the cover, the electronic device, or the method of making the cover, such discussions of one example are to be considered applicable to the other examples, whether or not they are explicitly discussed in the context of that example. Thus, in discussing a metal alloy in the context of the cover, such disclosure is also relevant to and directly supported in the context of the electronic device, the method of making the cover, and vice versa.

Covers for Electronic Devices

The present disclosure describes covers for electronic devices that can be strong and lightweight and have a colored or multi-colored appearance. The cover can provide an enclosure for an electronic device and the enclosure can include a light metal substrate. The term "light metal" refers to metals and alloys that include any metal of relatively low density including metal that is less than about 5 g/cm³ in density. In some cases, light metal can be a material including aluminum, magnesium, titanium, lithium, stainless steel, copper, niobium, zinc, and alloys or composites thereof. These light metals can have useful properties, such as low weight, high strength, and an appealing appearance. However, some of these metals can be easily oxidized at the surface, and may be vulnerable to corrosion or other chemical reactions at the surface. For example, magnesium or magnesium alloys in particular can be used to form covers for electronic devices because of the low weight and high strength of magnesium. Magnesium can have a somewhat porous surface that can be vulnerable to chemical reactions and corrosion at the surface. In some examples, magnesium or magnesium alloy can be treated by micro-arc oxidation to form a layer of protective oxide at the surface. With this example in mind, it is understood that magnesium alloy may be described herein as a class of alloys in some detail by way of example for convenience, but it is also understood that other light metal substrates can be freely substituted for the magnesium alloy examples herein with respect to the covers, electronic devices, and methods herein.

Using magnesium or magnesium alloy as an example class of metal substrates that can be used, this material can form a protective oxide layer that can increase the chemical resistance, hardness, and durability of the magnesium or magnesium alloy. However, a micro-arc oxidation layer can also create a dull appearance instead of the original luster of the metal. Therefore, the micro-arc oxidation layer may be covered with a coating layer to cover the micro-arc oxidation layer. If the coating layer is scratched or otherwise damaged the micro-arc oxidation layer underneath the coating layer may be exposed showing a different color than the micro-arc oxidation layer.

The present disclosure describes covers for electronic devices with a colored micro-arc oxidation layer. The colored micro-arc oxidation layer may have a color that matches, coordinates with, is similar to, or is the same as a color of a coating layer covering the colored micro-arc oxidation layer. Therefore, in examples of the present technology, if the coating layer is scratched or damaged on an edge or surface, the exposed colored micro-arc oxidation layer may match or maintain a similar color as the coating layer. The coating layer may be composed of multiple layers such as a primer coat, a base paint coat, a top coat, an anti-fingerprint coat, or a combination thereof. The colored micro-arc oxidation layer can have a color that matches, coordinates with, is similar to, or is the same as a color of any of the layers of the coating layer. The present technology can be described as offering dual surface finishing features with a metallic luster on light metal substrates.

The anionic inorganic protective compound can be described as a bridging compound, a linking compound, or a functional group. The anionic inorganic protective compound bonds with the cationic dye and can also bond or attach the cationic dye to a surface of the light metal substrate as part of a colored micro-arc oxidation layer. The anionic inorganic protective compound can also protect the cationic dye during a micro-arc oxidation (MAO) process. For example, an MAO process may include ultra-high temperatures up to or higher than about 1,500 degrees Celsius (C). Such high temperatures can cause a cationic dye to burn down. The anionic inorganic protective compound may protect the cationic dye and provide a resistance to burning down at ultra-high temperatures.

In certain examples, the anionic inorganic protective compound can include a silicate polymer. For example, sodium silicates can be well-configured or adapted for bonding to the cationic dyes of the present disclosure. Additionally, sodium silicate adhesives can be used for bonding a variety of porous surfaces and materials such as paper, mineral wool (used in insulation), perlite, mica and wood. Therefore, a sodium silicate can also be used as part of a colored micro-arc oxidation layer over a light metal substrate for purposes of the present technology. A micro-arc oxidation (MAO) process may include a solution in which the light metal substrate is placed to form the colored micro-arc oxidation layer. The solution or dispersion can include, for example, about 5 wt % to about 30 wt %, or from about 10 wt % to about 20 wt % of the silicate compound. Sodium silicate can be formed according to that shown in Formula 1 below.

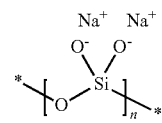

Formula 1

In Formula 1, n can be from about 4 to about 400, for example. The polymer can be terminated (as shown at the asterisk) by any of a number of terminal groups, but in one example, can be hydrogen (H). Furthermore, though sodium is shown as the cationic counterion, other counterions may alternatively be used, such as potassium, lithium, ammonium, etc., and are thus included in accordance with that shown in Formula 1.

In one example, the anionic inorganic protective compound can include a tripolyphosphate, a hexametaphosphate, or a combination of both. The tripolyphosphate and/or the hexametaphosphate can be used, for example, with the silicate compound. In these examples where both types of compounds are used (both the silicate and the phosphate), the solution or dispersion prepared to use for the microarc oxidation can be about 5 wt % to about 30 wt %, or from about 10 wt % to about 20 wt %, of the silicate compound, and can further include from about 1 wt % to about 10 wt %, from about 2 wt % to about 8 wt %, or from about 3% wt % to about 5 wt % of the tripolyphosphate, sodium hexametaphosphate, or a combination of both. As an example, sodium tripolyphosphate can have the formula as shown in Formula 2 below.

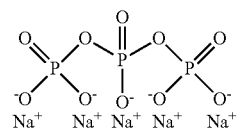

Formula 2

In further detail, as an example, sodium hexametaphosphate can be formed according to Formula 3 as shown below.

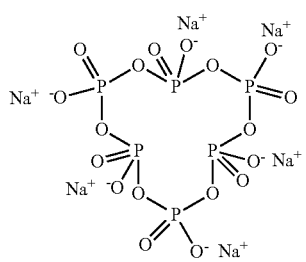

Formula 3

Again, though sodium is shown as the cationic counterion, other counterions may alternatively be used, such as potassium, lithium, ammonium, etc., and are thus included in accordance with that shown in Formulas 2 and 3.

In one example, the cationic dye can provide color or multi colors to the colored micro-arc oxidation layer. The cationic dye can be a water-soluble or a water-based dye. The cationic dye can include methylene blue, basic fuchsin, crystal violet, eosin, acid fuchsin, congo red, gentian violet, methyl violet, brilliant crystal glue, romanowsky dye, anthraquinone dyes, acridine orange, quinone-imine dyes, xanthene dyes, 2-amino-4-(azoyl)-azo-thiazole, basic blue 41 (C.I. 11105), C.I. acid blue 45, acid dye, alkaline dye, or a combination thereof. The solution or dispersion of the micro-arc oxidation (MAO) process can be about 3% wt to about 10% wt of the cationic dye.

In one example, in addition to the silicate compounds and/or the various phosphate compounds that can be included in the solution or dispersion for a micro-arc oxidation (MAO) process, other compounds that may be present can include a variety of chemicals or compounds including, but not limited to, potassium fluoride, potassium hydroxide or sodium hydroxide, fluorozirconate, sodium fluoride, ferric ammonium oxalate, phosphoric acid salt, graphite powder, silicon dioxide powder, polyethylene oxide alkylphenolic ether, or a combination thereof. The solution or dispersion can further include a surfactant. The surfactant can include alcohol sulfates, alkylbenzene sulfonates, sodium caseinate, sodium polyacrylate, sodium polyoxyethylene alkyl ether carboxylate, sodium dodecyl sulfate, or a combination thereof. The solution or dispersion can include about 0.3 wt % to about 2 wt % of the surfactant.

FIG. 1A shows an example cover 100 for an electronic device. The cover includes a light metal substrate 110 with an outer surface 115. A colored micro-arc oxidation layer 120 may be formed over the outer surface of the light metal substrate. The colored micro-arc oxidation layer may fully or partially cover the outer surface, for example. The colored micro-arc oxidation layer may be formed using a micro-arc oxidation (MAO) process where the light metal substrate is placed in a solution or dispersion and voltage is applied to the solution. The MAO process that produces the colored micro-arc oxidation layer using a solution that includes a cationic dye and an anionic inorganic protective compound to provide a color may be referred to as a color MAO treatment or a multi-color MAO treatment. The colored micro-arc oxidation layer can be about 2 to about 15 micro meters thick.

Figure 1B:
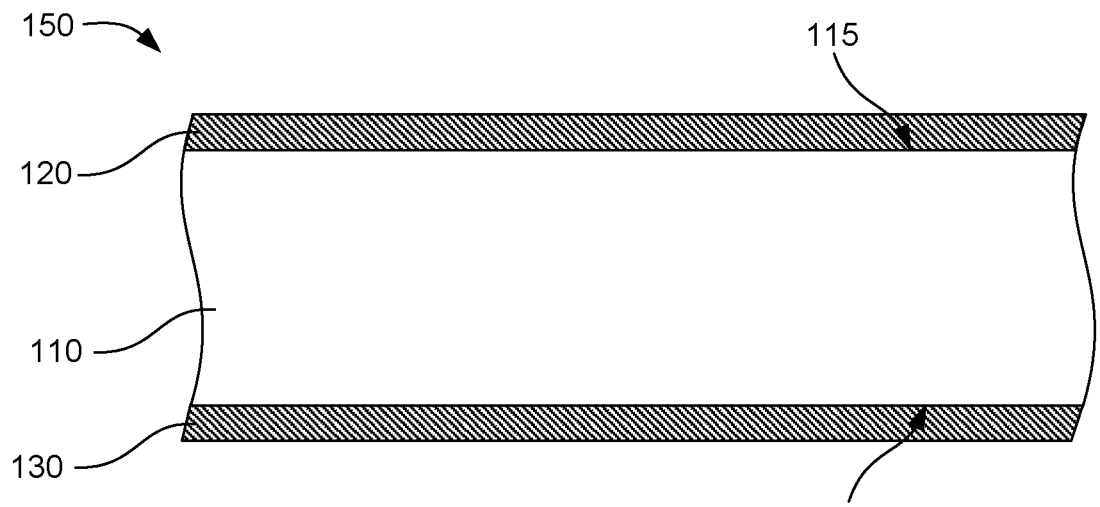

FIG. 1B shows an example cover 150 for an electronic device. The cover includes a light metal substrate 110 with an outer surface 115 and a second outer surface 125 where the second outer surface faces an opposite direction than the outer surface. In this example, a colored micro-arc oxidation layer 120 covers the outer surface of the light metal substrate, and a second colored micro-arc oxidation layer 130 covers the second outer surface. The various layers can either partially or fully cover the various surfaces, for example. The colored micro-arc oxidation layer and the second colored micro-arc oxidation layer may be formed using the same micro-arc oxidation (MAO) process or different MAO processes. The colored micro-arc oxidation layer and the second colored micro-arc oxidation layer may be the same color or may be different colors from one another.

Figure 2:
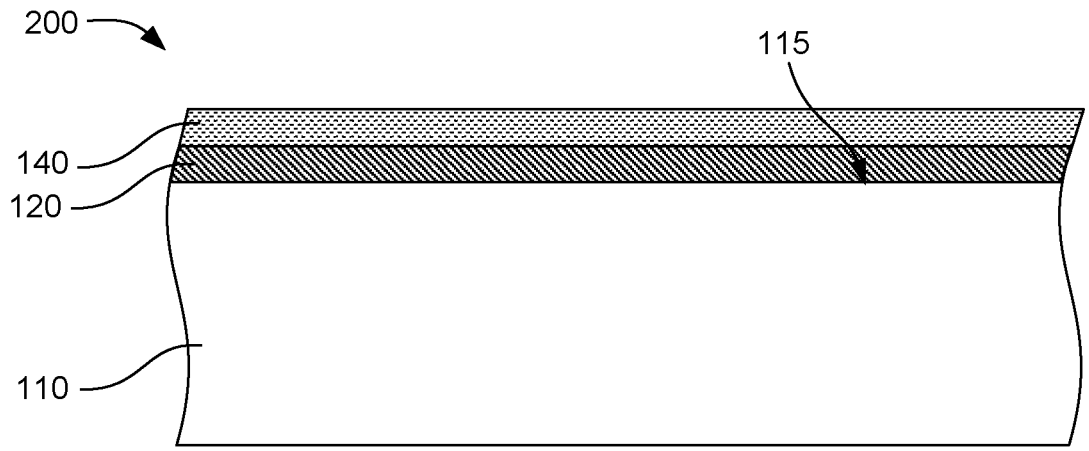
FIG. 2 is a cross-sectional view illustrating another example cover for an electronic device with a coating layer in accordance with examples of the present disclosure.

FIG. 2 shows an example cover 200 for an electronic device. The cover includes a light metal substrate 110 with an outer surface 115. A colored micro-arc oxidation layer 120 is over the outer surface of the light metal substrate. Again, the colored micro-arc oxidation layer can fully or partially cover the outer surface. A coating layer 140 in this example can fully or partially cover an exposed surface of the colored micro-arc oxidation layer. The coating layer is over a surface of the colored micro-arc oxidation layer that is facing opposite the surface of the colored micro-arc oxidation layer that is in contact with the light metal substrate. The coating layer can be a single layer or multiple layers. For example, the coating layer can be composed of a primer coat, a base paint coat, a top coat, an anti-fingerprint coat, or a combination thereof. The different layers of the coating layer can be the same color as one another or can be of a different color. The colored micro-arc oxidation layer can match, be similar to, or the same color as any one of the layers of the coating layer. A layer of the coating layer, such as an anti-fingerprint layer, can be transparent. The coating layer can be composed of paint or other chemicals and compounds. The coating layers or paint coatings can be any number of colors and can be transparent, semi-transparent, or opaque.

In one example, the primer coat of the coating layer 140 can be composed of epoxy, epoxy-polyester, polyester, polyurethane, polyurethane copolymer, or a combination therefore. The primer coat can be about 10 to about micrometers thick. The primer coat can be cured in a temperature range of about 60 to about 80 degrees C. The primer coat can be cured for about 15 to about 40 minutes.

In one example, the base coat of the coating layer 140 can be composed of polyester, polyacrylic, polyurethane and polyurethane copolymer with pigments including carbon black, titanium dioxide, clay, mica, talc, barium sulfate, calcium carbonate, synthetic pigment, metallic powder, aluminum oxide, an organic powder, an inorganic powder, plastic bead, color pigments and dyes, or a combination therefore. The base coat can be about 8 to about 20 micrometers thick. The base coat can be cured in a temperature range of about 60 to about 80 degrees C. The base coat can be cured for about 15 to about 40 minutes.

In one example, the top coat of the coating layer 140 can be composed of polyester, acrylic, polyurethane, polyurethane copolymer, or a combination therefore. The top coat can be about 10 to about 25 micrometers thick. The top coat can be cured in a temperature range of about 60 to about 80 degrees C. The top coat can be cured for about 15 to about 40 minutes.

In an alternate example, the top coat of the coating layer 140 can be composed of polyacrylic, polyurethane, urethane acrylates, acrylic acrylates, and epoxy acrylates, or a combination therefore. The top coat can be about 10 to about 25 micrometers thick. Such a top coat can be cured in a temperature range of about 50 to about 60 degrees C. for about 10 to about 15 minutes followed by exposure to ultraviolet (UV) at about 700 to about 1,300 mJ/cm$^2$ for about 10 to about 30 seconds.

Figure 3:
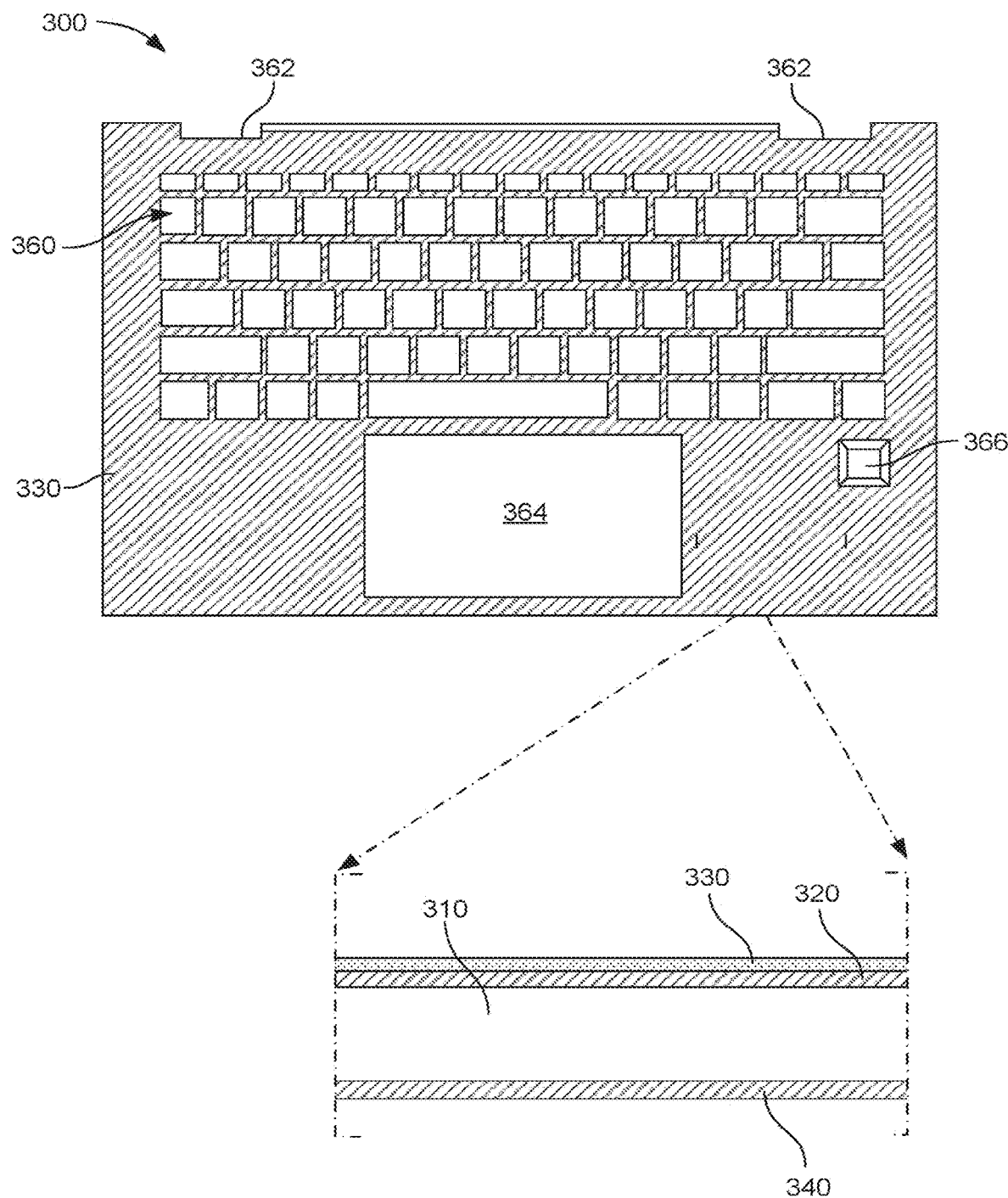
FIG. 3 is a top down view and a partial cross-sectional view of an example cover for an electronic device in accordance with the present disclosure.

FIG. 3 shows another example cover 300 for an electronic device. This example is a top cover for the keyboard portion of a laptop (sometimes referred to as a "laptop cover C"). The cover includes key openings 360 for the keyboard buttons (not shown) to be positioned therethrough, hinge recesses 362 to receive a hinge (not shown), a track pad opening 364 to receive a track pad (not shown), and a fingerprint scanner opening 366 to receive a fingerprint scanner (not shown). These are merely examples of structures that may be present, and are illustrative of many of a number of other structural components used with this type of top cover. The cover can be mostly made up of a light metal substrate 310 covered with a colored micro-arc oxidation layer 320. The colored micro-arc oxidation layer can be covered with a coating layer 330 that may be composed of multiple layers. The light metal substrate may not be directly visible in this example because it is covered by the colored micro-arc oxidation layer and the coating layer.

To show the various materials in this example more clearly, a partial cross-sectional view is shown along plane "A" designated further by the dashed to and dotted lines/arrows. This cross-sectional view shows the cross-sectional view of the light metal substrate 310, the colored micro-arc oxidation layer 320, the coating layer 330, and a second colored micro-arc oxidation layer 340.

As used herein, "cover" refers to the exterior shell of an electronic device that includes or is in the form of an enclosure, and a portion thereof (or the structure thereof) includes a light metal substrate. In other words, the cover can be adapted to contain the internal electronic components of the electronic device. The cover can be an integral part of the electronic device. The term "cover" is not meant to refer to the type of removable protective cases that are often purchased separately for an electronic device (especially smartphones and tablets) and placed around the exterior of the electronic device. Covers as described herein can be used on a variety of electronic devices. For example, a laptop, a desktop, a keyboard, a mouse, a printer, a smartphone, a tablet, a monitor, a television, a speaker, a game console, a video player, an audio player, or a combination thereof. In various examples, the light metal substrate for these covers can be formed by molding, casting, machining, bending, working, stamping, or another process. In one example, a light metal substrate can be milled from a single block of metal. In other examples, the cover can be made from multiple panels. For example, laptop covers sometimes include four separate cover pieces forming the complete cover of the laptop. The four separate pieces of the laptop cover are often designated as cover A (back cover of the monitor portion of the laptop), cover B (front cover of the monitor portion), cover C (top cover of the keyboard portion) and cover D (bottom cover of the keyboard portion). Covers can also be made for smartphones and tablet computers with a single metal piece or multiple metal panels.

As used herein, a layer that is referred to as being "on" a lower layer can be directly applied to the lower layer, or an intervening layer or multiple intervening layers can be located between the layer and the lower layer. In some examples, the covers described herein can include a light metal substrate and a protective coating can be applied on the light metal substrate. Accordingly, a layer that is "on" a lower layer can be located further from the light metal substrate. However, in some examples there may be other intervening layers such as a micro-arc oxidation layer underneath the coating layer. Furthermore, the coating layer itself may include multiple layers, such as a primer layer, a base layer, a topcoat layer, an anti-fingerprint layer, and any other intervening layers. In some examples, the protective coating and any other layers may be applied to an exterior surface of the light metal substrate. Thus, a "higher" layer applied "on" a "lower" layer may be located farther from the light metal substrate and closer to a viewer viewing the cover from the outside. In further examples, the protective coating can be applied to all surfaces of the light metal substrate.

It is noted that when discussing covers for electronic devices, the electronic devices themselves, or methods of making covers for electronic devices, such discussions can be considered applicable to one another whether or not they are explicitly discussed in the context of that example. Thus, for example, when discussing the metals used in the light metal substrate in the context of one of the example covers, such disclosure is also relevant to and directly supported in the context of the electronic devices and/or methods, and vice versa. It is also understood that terms used herein will take on their ordinary meaning in the relevant technical field unless specified otherwise. In some instances, there are terms defined more specifically throughout or included at the end of the present disclosure, and thus, these terms are supplemented as having a meaning described herein.

Electronic Devices

A variety of electronic devices can be made with the covers described herein. In various examples, such electronic devices can include various electronic components enclosed by the cover. As used herein, "encloses" or "enclosed" when used with respect to the covers enclosing electronic components can include covers completely enclosing the electronic components or partially enclosing the electronic components. Many electronic devices include openings for charging ports, input/output ports, headphone ports, and so on. Accordingly, in some examples the cover can include openings for these purposes. Certain electronic components may be designed to be exposed through an opening in the cover, such as display screens, keyboard keys, buttons, track pads, fingerprint scanners, cameras, and so on. Accordingly, the covers described herein can include openings for these components. Other electronic components may be designed to be completely enclosed, such as motherboards, batteries, sim cards, wireless transceivers, memory storage drives, and so on. Additionally, in some examples a cover can be made up of two or more cover sections, and the cover sections can be assembled together with the electronic components to enclose the electronic components. As used herein, the term "cover" can refer to an individual cover section or panel, or collectively to the cover sections or panels that can be assembled together with electronic components to make the complete electronic device.

In further examples, the electronic device can be a laptop, a desktop, a keyboard, a mouse, a printer, a smartphone, a tablet, a monitor, a television, a speaker, a game console, a video player, an audio player, or a variety of other types of electronic devices. In certain examples, the chamfered edge or edges can be located in decorative locations on the cover. Some examples include chamfered edges around track pads, around fingerprint scanners, around an edge of a logo, and so on. In further detail, there may be outer periphery of the light metal substrate that can be similarly chamfered.

Methods of Making Covers for Electronic Devices

In some examples, the covers described herein can be made by first forming the light metal substrate. This can be accomplished using a variety of processes, including molding, insert molding, forging, casting, machining, stamping, bending, working, and so on. The light metal substrate can be made from a variety of metals. In one example, the light metal substrate CNC can be milled, stamped, or forged into a shape with a feature to be joined with an insert molding plastic part. In certain examples, the light metal substrate can include aluminum, magnesium, lithium, zinc, titanium, niobium, stainless steel, copper, an alloy thereof, or a composite thereof. As mentioned above, in some examples the light metal substrate can be a single piece while in other examples the light metal substrate can include multiple pieces that independently make up a portion of the cover. Additionally, in some examples the light metal substrate can be a composite made up of multiple metals combined, such as having layers of multiple different metals or panels or other portions of the light metal substrate being different metals.

In one example, a light metal substrate is degreased prior to being subjected to a micro-arc oxidation (MAO) process. The degreasing process may employ a chemical compound where the chemical compound has a pH control at about 9 to about 13 and is composed of sodium carbonate and NaOH. The chemical compound may further include a surfactant. The surfactant may be about 0.3 wt % to about 1.5 wt % of the chemical compound and may include: sodium caseinate, sodium polyacrylate, sodium polyoxyethylene alkyl ether carboxylate, sodium lauryl sulphate, and/or sodium dodecyl sulfate. The degreasing process may include a duration time of about 30 to about 180 seconds. The light metal substrate may be placed in a bath of the chemical compound where the bath temperature is about 25° C. to about 60° C.

After the degreasing process, the light metal substrate may be subject to the micro-arc oxidation (MAO) process. The MAO process may include submersing the light metal substrate in a solution that includes a cationic dye and an anionic inorganic protective compound. The solution may be mixed prior to performing the MAO process. The MAO process may form a colored micro-arc oxidation layer on a surface of the light metal substrate. After the MAO process, the colored micro-arc oxidation layer may be covered with a coating layer. Applying the coating layer may be performed using any of a number of methods or number of layers. For example, the coating layer may include applying a primer coat. A base coat may be applied over the primer coat. An ultraviolet topcoat may be applied over the base coat. The ultraviolet topcoat may be dried and then exposed to ultraviolet radiation.

Figure 4:
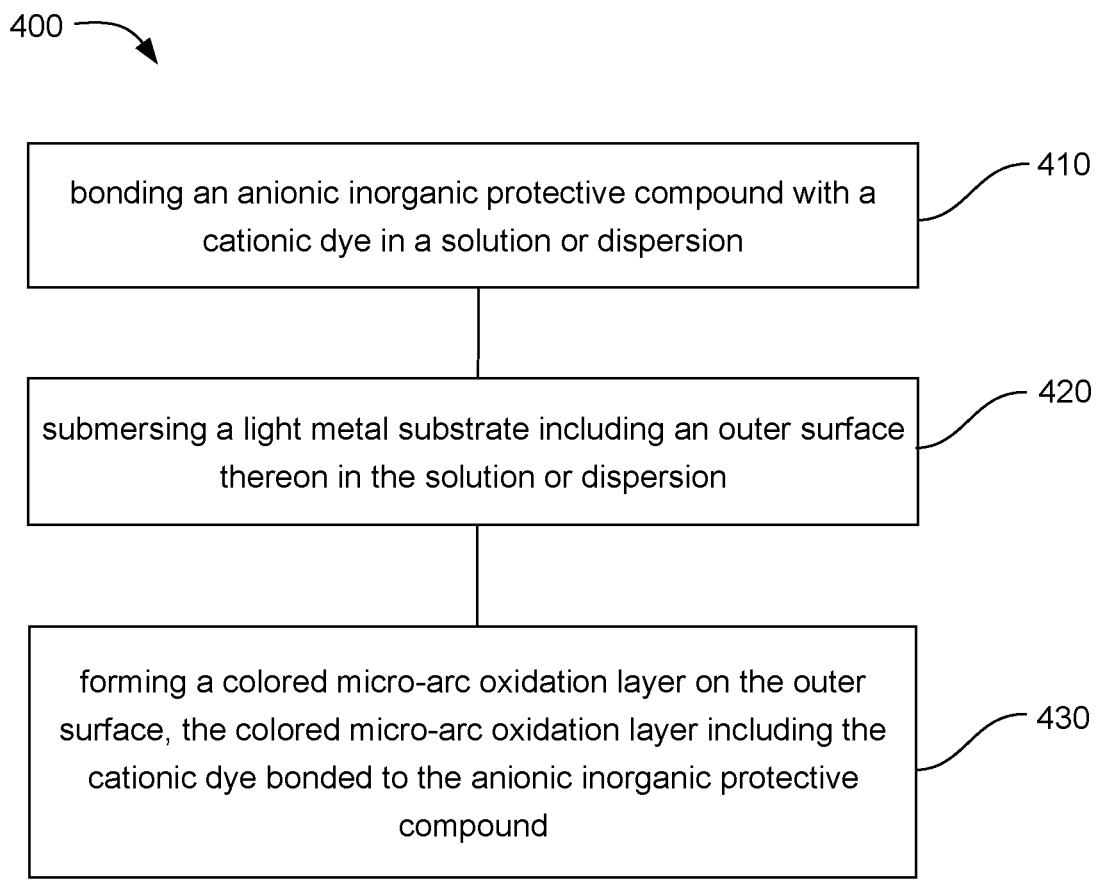
FIG. 4 is a block diagram of an example system for micro-arc oxidation in accordance with the present disclosure.

FIG. 4 is a flowchart illustrating an example method 400 of making a cover for an electronic device. The method includes bonding 410 an anionic inorganic protective compound with a cationic dye in a solution or dispersion. The method further includes submersing 420 a light metal substrate including an outer surface thereon in the solution or dispersion. The method further includes forming 430 a colored micro-arc oxidation layer on the outer surface, the colored micro-arc oxidation layer including the cationic dye bonded to the anionic inorganic protective compound. The method can further include forming a second colored micro-arc oxidation layer on a second surface of the light metal substrate wherein the second surface faces an opposite direction than the outer surface. The method can further include applying a coating layer on the colored micro-arc oxidation layer, wherein the coating layer includes a primer coat, a base paint coat, a top coat, an anti-fingerprint coat, or a combination thereof.

Light Metal Substrates for Electronic Device Covers

The light metal substrate can be made from a single metal, a metallic alloy, a combination of sections made from multiple metals, or a combination of metal and other materials. In certain examples, the light metal substrate can include aluminum, magnesium, lithium, zinc, titanium, niobium, stainless steel, copper, an alloy thereof, or a composite thereof. Non-limiting examples of elements that can be included in aluminum or magnesium alloys can include aluminum, magnesium, titanium, lithium, niobium, zinc, bismuth, copper, cadmium, iron, thorium, strontium, zirconium, manganese, nickel, lead, silver, chromium, silicon, tin, gadolinium, yttrium, calcium, antimony, cerium, lanthanum, or others.

In some examples, the light metal substrate can include aluminum magnesium alloys made up of about 0.5 wt % to about 13 wt % magnesium by weight and 87 wt % to 99.5 wt % aluminum. Examples of specific aluminum magnesium alloys can include 1050, 1060, 1199, 2014, 2024, 2219, 3004, 4041, 5005, 5010, 5019, 5024, 5026, 5050, 5052, 5056, 5059, 5083, 5086, 5154, 5182, 5252, 5254, 5356, 5454, 5456, 5457, 5557, 5652, 5657, 5754, 6005, 6005A, 6060, 6061, 6063, 6066, 6070, 6082, 6105, 6162, 6262, 6351, 6463, 7005, 7022, 7068, 7072, 7075, 7079, 7116, 7129, and 7178.

In further examples, the light metal substrate can include magnesium metal, a magnesium alloy that can be about 99 wt % to less than 100 wt % magnesium by weight, or a magnesium alloy that is from about 50 wt % to about 99 wt % magnesium by weight. In a particular example, the light metal substrate can include an alloy including magnesium and aluminum. Examples of magnesium-aluminum alloys can include alloys made up of from about 91 wt % to about 99 wt % magnesium by weight and from about 1 wt % to about 9 wt % aluminum, and alloys made up of about 0.5 wt % to about 13 wt % magnesium by weight and 87 wt % to 99.5 wt % aluminum. Specific examples of magnesium-aluminum alloys can include AZ63, AZ81, AZ91, AM50, AM60, AZ31, AZ61, AZ80, AE44, AJ62A, ALZ391, AMCa602, LZ91, and Magnox.

The light metal substrate can be shaped to fit any type of electronic device, including the specific types of electronic devices described herein. In some examples, the light metal substrate can have any thickness suitable for a particular type of electronic device. The thickness of the metal in the light metal substrate can be selected to provide a desired level of strength and weight for the cover of the electronic device. In some examples, the light metal substrate can have a thickness from about 0.5 mm to about 2 cm, from about 1 mm to about 1.5 cm, from about 1.5 mm to about 1.5 cm, from about 2 mm to about 1 cm, from about 3 mm to about 1 cm, from about 4 mm to about 1 cm, or from about 1 mm to about 5 mm, though thicknesses outside of these ranges can be used.

Micro-Arc Oxidation for Electronic Device Covers

Figure 5:
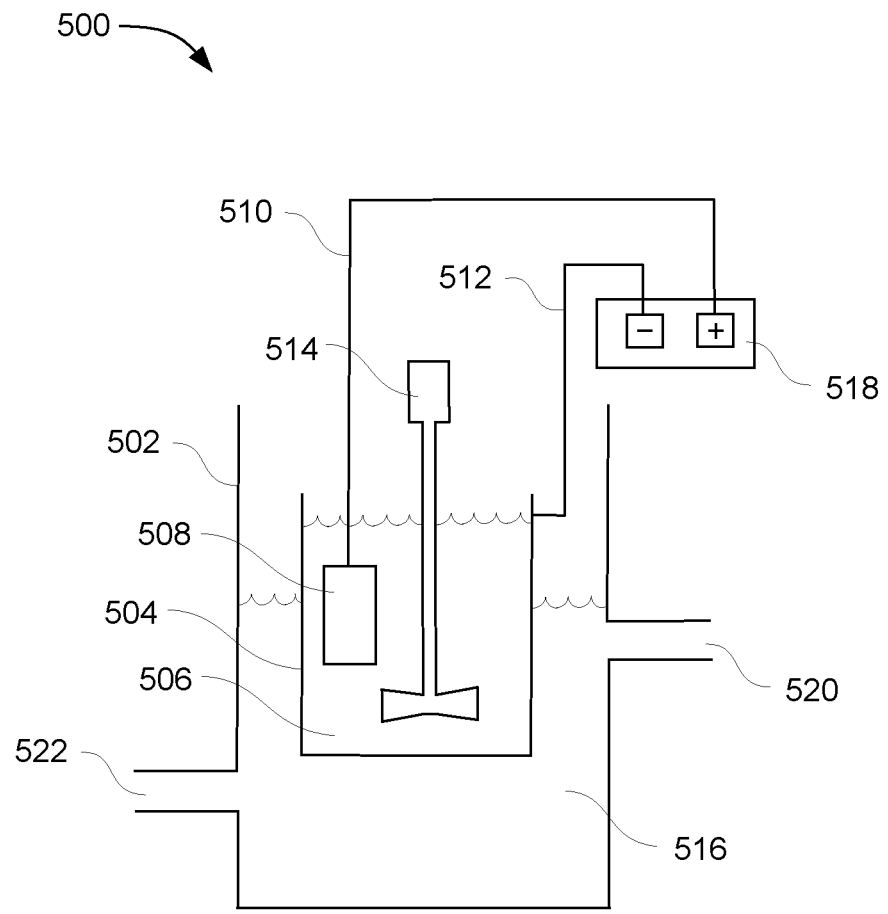
FIG. 5 is a flowchart illustrating an example method of making a cover for an electronic device in accordance with the present disclosure.

FIG. 5 illustrates a block diagram 500 for micro-arc oxidation (MAO). In one example, a colored micro-arc oxidation layer can be applied or formed over a light metal substrate 508 using a micro-arc oxidation process. Micro-arc oxidation, also known as plasma electrolytic oxidation, is an electrochemical process where the surface of a metal is oxidized using micro-discharges of compounds on the surface of the light metal substrate when immersed in a chemical or electrolytic bath of a solution 506, for example. The solution may include predominantly water with about 1 wt % to about 15 wt % electrolytic compound(s), e.g., alkali metal silicates, alkali metal phosphates, alkali metal hydroxides, alkali metal fluorides, alkali metal aluminates, the like, or a combination thereof. The electrolytic compounds may likewise be included at from about 1.5 wt % to about 3.5 wt %, or from about 2 wt % to about 3 wt %, though these ranges are not considered limiting. As mentioned, the solution may also include the silicate compounds and/or the phosphate compounds that can be complexed or otherwise interact with the cationic dyes to protect the dyes so that they can impart color to the MAO layer.

In one example, a high-voltage current can be applied to the light metal substrate 508 to create plasma on the surface of the light metal substrate 508. In this process, the light metal substrate 508 can act as the anode immersed in the solution 506, and the counter electrode or cathode can be any other electrode that is also in contact with the solution. In some examples, the cathode can be an inert metal such as stainless steel. In certain examples, the container 504 holding the solution 506 can be conductive and the container 504 itself can be used as the cathode. A high direct current or alternating voltage can be applied to the light metal substrate 508 and the container 504 using a direct current power source 518. The power source 518 can be connected to the cathode and anode using wires 510 and 512. In some examples, the voltage can be about 200 V or higher, such as about 200 V to about 600 V, about 300 V to about 800 V, about 250 V to about 500 V, or about 200 V to about 300 V. Temperatures can be from about 20° C. to about 40° C., or from about 25° C. to about 35° C., for example, though temperatures outside of these ranges can be used including ultra-high temperatures up to about 1,500° C.

The solution 506 can include a cationic dye and an anionic inorganic protective compound. The solution 506 can be mixed by a mixer 514 before and during the micro-arc oxidation (MAO) process. The container 504 can be placed in a container 502 such that the container 504 is partially surrounded by a coolant 516. The coolant 516 may be passed through the container 502 via coolant inlet 520 and coolant outlet 522.

The micro-arc oxidation (MAO) process can oxidize the surface to form an oxide layer from the light metal substrate material. The oxide layer can, in some instances, enhance the mechanical, wear, thermal, dielectric, and corrosion properties of the substrate. The electrolyte solution can include a variety of electrolytes, such as a solution of potassium hydroxide. In some examples, the light metal substrate can include a micro-arc oxidation layer on one side, or on both sides.

Definitions

It is noted that, as used in this specification and the appended claims, the singular forms "a," "an," and "the" include plural referents unless the content clearly dictates otherwise.

The term "about" as used herein, when referring to a numerical value or range, allows for a degree of variability in the value or range, for example, within 5% or other reasonable added range breadth of a stated value or of a stated limit of a range. The term "about" when modifying a numerical range is also understood to include the exact numerical value indicated, e.g., the range of about 1 wt % to about 5 wt % includes 1 wt % to 5 wt % as an explicitly supported sub-range.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used to describe pigment colorants and other pigments such as organometallics, ferrites, ceramics, etc. In one specific example, however, the pigment is a pigment colorant.

As used herein, a plurality of items, structural elements, compositional elements, and/or materials may be presented in a common list for convenience. However, these lists should be construed as though the individual members of the list are individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include the numerical values explicitly recited as the limits of the range, and also to include all the individual numerical values or sub-ranges encompassed within that range as if individual numerical values and sub-ranges are explicitly recited. For example, a layer thickness from about 0.1 µm to about 0.5 µm should be interpreted to include the explicitly recited limits of 0.1 µm to 0.5 µm, and to include thicknesses such as about 0.1 µm and about 0.5 µm, as well as subranges such as about 0.2 µm to about 0.4 µm, about 0.2 µm to about 0.5 µm, about 0.1 µm to about 0.4 µm etc.

EXAMPLES

The following illustrates examples of the present disclosure. However, it is to be understood that the following is illustrative of the application of the principles of the present disclosure. Numerous modifications and alternative compositions, devices, methods, and systems may be devised without departing from the scope of the present disclosure.

Example 1

An example cover for an electronic device can be prepared, as follows. A light metal substrate formed out of a magnesium alloy. The light metal substrate is degreased using sodium carbonate and NaOH. A micro-arc oxidation (MAO) solution is mixed including a cationic dye and an anionic inorganic protective compound, where the anionic inorganic protective compound includes sodium silicate. The light metal substrate is subjected to a MAO process including submersing the light metal substrate in the solution and applying a voltage. A colored micro-arc oxidation layer is formed over a surface of the light metal substrate as a result of the MAO process, where the colored micro-arc oxidation layer is 3-15 micrometers thick.

Example 2

An example cover for an electronic device can be prepared, as follows. A light metal substrate formed out of a magnesium alloy. The light metal substrate is degreased using sodium carbonate and NaOH. A micro-arc oxidation (MAO) solution is mixed including a cationic dye and an anionic inorganic protective compound, where the anionic inorganic protective compound includes sodium silicate and sodium tripolyphosphate. The light metal substrate is subjected to a MAO process including submersing the light metal substrate in the solution and applying a voltage. A colored micro-arc oxidation layer is formed over a surface of the light metal substrate as a result of the MAO process, where the colored micro-arc oxidation layer is 3-15 micrometers thick.

Example 3

An example cover for an electronic device can be prepared, as follows. A light metal substrate formed out of a magnesium alloy. The light metal substrate is degreased using sodium carbonate and NaOH. A micro-arc oxidation (MAO) solution is mixed including a cationic dye and an anionic inorganic protective compound, where the anionic inorganic protective compound includes sodium silicate and sodium hexametaphosphate. The light metal substrate is subjected to a MAO process including submersing the light metal substrate in the solution and applying a voltage. A colored micro-arc oxidation layer is formed over a surface of the light metal substrate as a result of the MAO process, where the colored micro-arc oxidation layer is 3-15 micrometers thick. A primer coat is applied over the colored micro-arc oxidation layer. The primer coat is cured at 60-80° C. for 30-60 minutes. A base coat is applied over the primer coat. The base coat is cured at 60-80° C. for 30-60 minutes. An ultraviolet coat is applied over the base coat. The ultraviolet coat is dried at 50-60° C. for 5-10 minutes. The ultraviolet coat is exposed to ultraviolet radiation with an intensity of 700-1200 mJ/cm$^2$ for 10-30 seconds.

While the disclosure has been described with reference to certain descriptions and examples, it is appreciated that various modifications, changes, omissions, and substitutions can be made without departing from the teachings of the present disclosure. It is intended, therefore, that the present disclosure be limited only by the scope of the following claims.

What is claimed is:

1. A cover for an electronic device comprising:
   a light metal substrate including an outer surface; and
   a colored micro-arc oxidation layer on the outer surface of the light metal substrate, the colored micro-arc oxidation layer including a cationic dye bonded to an anionic inorganic protective compound.

2. The cover of claim 1, wherein the light metal substrate includes aluminum, magnesium, lithium, zinc, titanium, niobium, stainless steel, copper, an alloy thereof, or a composite thereof.

3. The cover of claim 1, wherein the anionic inorganic protective compound includes a silicate compound.

4. The cover of claim 3, wherein the anionic inorganic protective compound further includes a tripolyphosphate, a hexametaphosphate, or a combination thereof.

5. The cover of claim 1, wherein the cationic dye is a water-soluble dye including methylene blue, basic fuchsin, crystal violet, eosin, acid fuchsin, congo red, gentian violet, methyl violet, brilliant crystal glue, romanowsky dye, anthraquinone dyes, acridine orange, quinone-imine dyes, xanthene dyes, 2-amino-4-(azoyl)-azo-thiazole, basic blue 41, C.I. acid blue 45, acid dye, alkaline dye, or a combination thereof.

6. The cover of claim 1, wherein the colored micro-arc oxidation layer is applied using a solution or dispersion including potassium fluoride, potassium hydroxide or sodium hydroxide, fluorozirconate, sodium hexametaphosphate, sodium fluoride, ferric ammonium oxalate, phosphoric acid salt, graphite powder, silicon dioxide powder, polyethylene oxide alkylphenolic ether, or a combination thereof.

7. The cover of claim 1, wherein the colored micro-arc oxidation layer is applied using a solution or dispersion including a surfactant, wherein the surfactant includes alcohol sulfates, alkylbenzene sulfonates, sodium caseinate, sodium polyacrylate, sodium polyoxyethylene alkyl ether carboxylate, sodium dodecyl sulfate, or a combination thereof.

8. The cover of claim 1, further comprising a coating layer over the colored micro-arc oxidation layer, the coating layer including a primer coat, a base paint coat, a top coat, an anti-fingerprint coat, or a combination thereof.

9. The cover of claim 8, wherein the cationic dye provides a color at the colored micro-arc oxidation layer that is a same color as a coating color provided by the coating layer.

10. The cover of claim 1, further comprising a second colored micro-arc oxidation layer on a second outer surface of the light metal substrate, wherein the second outer surface faces opposite the outer surface.

11. An electronic device comprising:
    an electronic component; and
    a cover enclosing the electronic component, the cover comprising:
    a light metal substrate; and
    a colored micro-arc oxidation layer on an outer surface of the light metal substrate, the colored micro-arc oxidation layer including a cationic dye bonded to an anionic inorganic protective compound.

12. The electronic device of claim 11, wherein the electronic device is a laptop, a desktop computer, a keyboard, a mouse, a smartphone, a tablet, a monitor, a television screen, a speaker, a game console, a video player, an audio player, or a combination thereof.

13. The electronic device of claim 11, further comprising a coating layer over the colored micro-arc oxidation layer, the coating layer including a primer coat, a base paint coat, a top coat, an anti-fingerprint coat, or a combination thereof.

14. A method of making a cover for an electronic device comprising:
    bonding an anionic inorganic protective compound with a cationic dye in a solution or dispersion;
    submersing a light metal substrate including an outer surface thereon in the solution or dispersion; and
    forming a colored micro-arc oxidation layer on the outer surface, the colored micro-arc oxidation layer including the cationic dye bonded to the anionic inorganic protective compound.

15. The method of claim 14, further comprising applying a coating layer on the colored micro-arc oxidation layer, wherein the coating layer includes a primer coat, a base paint coat, a top coat, an anti-fingerprint coat, or a combination thereof.

* * * * *